United States Patent [19]

Goeckler

[11] Patent Number: 5,995,542
[45] Date of Patent: Nov. 30, 1999

[54] FILTER CIRCUIT ARRANGEMENT HAVING A PLURALITY OF CASCADED FIR FILTERS

[75] Inventor: Heinz Goeckler, Backnang, Germany

[73] Assignee: Robert Bosch GmbH, Stuttgart, Germany

[21] Appl. No.: 08/876,170

[22] Filed: Jun. 13, 1997

[51] Int. Cl.[6] .................................................. H03H 7/30
[52] U.S. Cl. .................... 375/229; 375/350; 375/233; 364/724.1; 364/724.19
[58] Field of Search .................... 375/229, 350, 375/233, 341, 297; 364/724.1, 724.17, 724.19

[56] References Cited

U.S. PATENT DOCUMENTS

| | | | |
|---|---|---|---|
| 4,344,149 | 8/1982 | Meeberg et al. | 364/724.1 |
| 4,612,625 | 9/1986 | Bertrand | 364/724.1 |
| 4,785,411 | 11/1988 | Thompson et al. | 364/724.19 |

OTHER PUBLICATIONS

Yong–chin Lim et al., The design of cascaded FIR filters, IEEE, 181–183, May 12, 1996.
Lim, Y. et al./The Optimum Design of One— and . . . /Feb. 1993.
Mitra, S. et al./Handbook for Digital Signal . . . /John Wiley &.

Primary Examiner—Stephen Chin
Assistant Examiner—Shuwang Liu
Attorney, Agent, or Firm—Michael J. Striker

[57] ABSTRACT

The filter circuit arrangement provides the properties of an FIR filter of length N, with K ($K \geq 2$) cascaded FIR-filter members. One FIR-filter member (5.K) is formed as an equalizer filter of length $N_A$ and the remaining FIR-filter members (5.1 to 5.(K−1)) are 1/M band filters of length $N_k$, so that $$N_A \leq N - \sum_{k=1}^{K-1} P_k,$$

wherein $$P_k = N_k - 2\lfloor \tfrac{1}{2}(N_k-1)/M_k \rfloor.$$

8 Claims, 5 Drawing Sheets

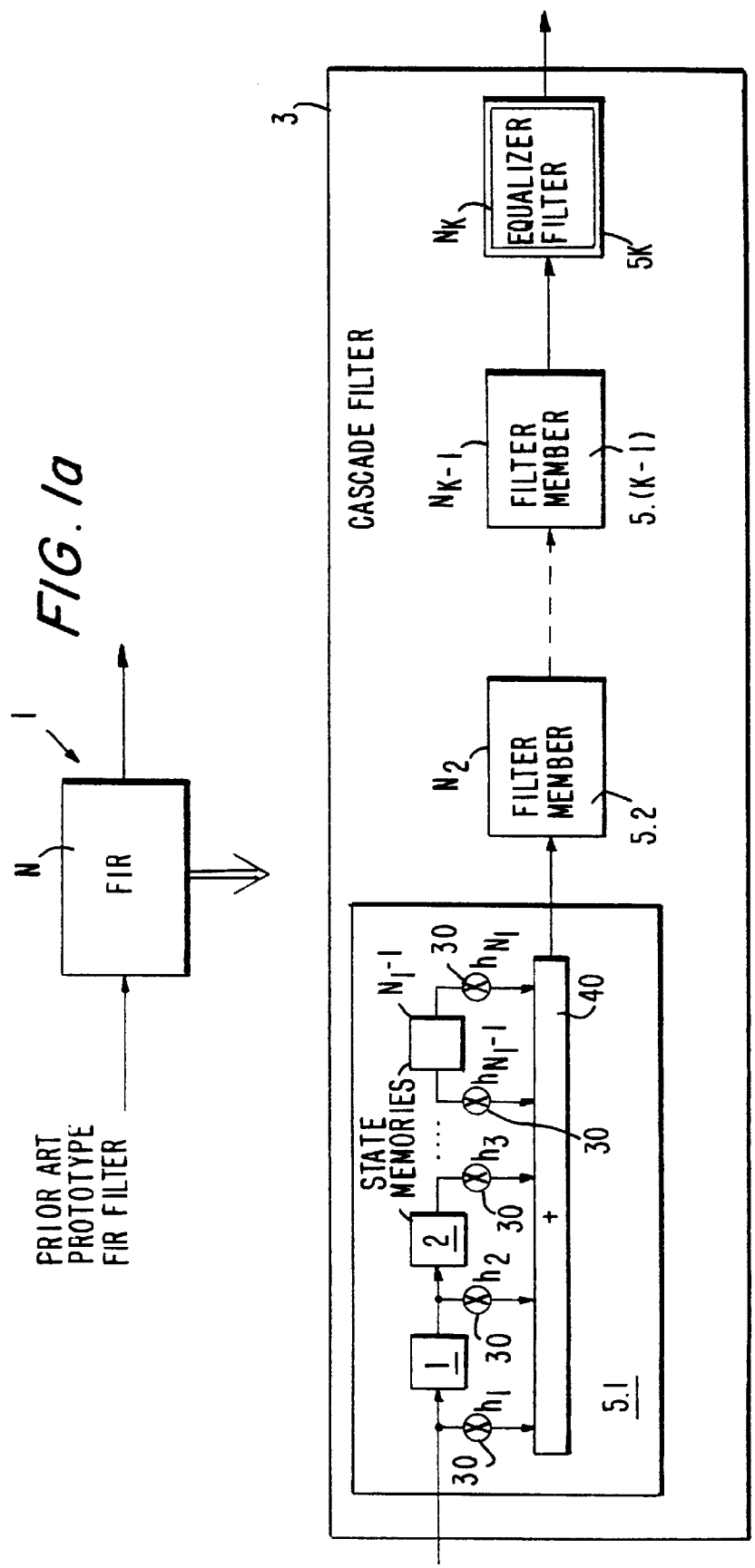

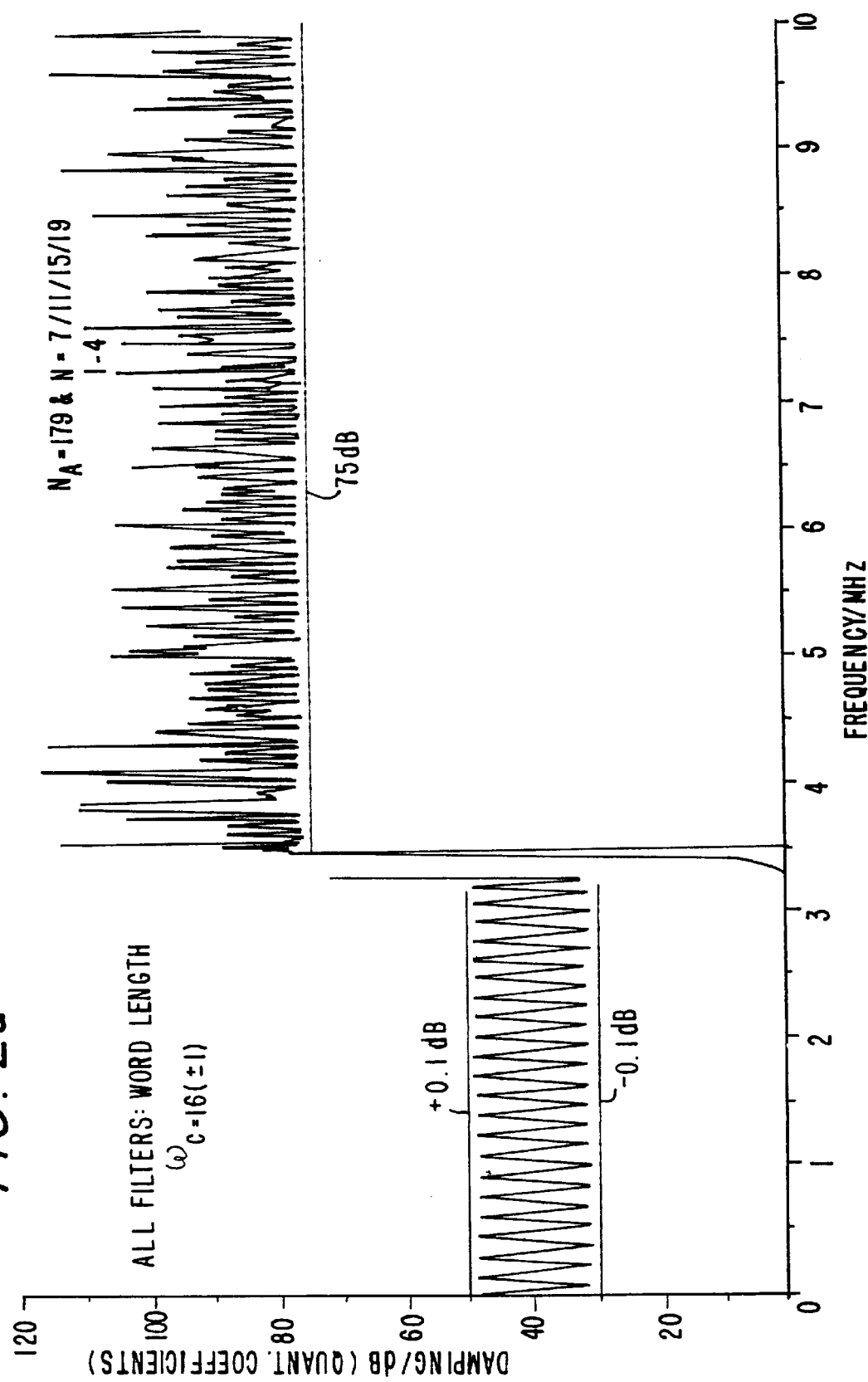

FILTER CIRCUIT ARRANGEMENT HAVING A PLURALITY OF CASCADED FIR FILTERS

BACKGROUND OF THE INVENTION

The present invention relates to a filter circuit arrangement having a plurality of cascaded FIR-filter members each of which has a length N and a group of N−1 state memories connected in series with each other to obtain the properties of an FIR-prototype filter, in which the input values and output values of the state memories are multipliable with filter coefficients and the resulting products can be added to obtain an output signal.

FIR (finite impulse response) filters of this type are known and are used in many different fields. They especially provide the advantage of high stability. In making a low-pass or high-pass FIR filter the aim often exists to obtain steep pulse sides at the input and output at the same sampling frequency. The position of the transmission range or the suppressed range should be arbitrarily selectable. Besides exacting requirements are necessary for attenuation in the transmitting region or in the cutoff region.

These goals make it indispensable to use a filter with a large filter length N. At the same time the word length of the filter coefficients must be increased with an increase of the filter length so as to counter frequency errors adding statistically by coefficient quantization.

This however has the consequence that the circuitry expense climbs to the same extent, especially the multiplier circuits are expense to make.

Expenditure limits regarding the number of multiplication circuits are described in the paper "The Optimum Design of One and Two-Dimensional FIR Filters Using the Frequency Response Masking Technique" by Y. C. Lim and Yong Lian, IEEE Transactions on Circuits and Systems, Vol. 40, No. 2, February 1993 and in "Handbook for Digital Signal Processing", John Wiley & Sons, New York. The described process is called "frequency response masking" engineering. This technique replaces each state memory in an FIR filter by several cascaded state memories. Pulse steepness or transient steepness can be increased relative to the original FIR filter without increasing the number of coefficients and of course the number of multiplication circuits. However this filter becomes complicated and expensive, because of the considerably increase in the number of state memories.

SUMMARY OF THE INVENTION

It is an object of the present invention to provide an improved filter circuit arrangement with a plurality of cascaded FIR-filters, each of which have a length N and a group of N−1 state memories connected in series with each other, to obtain the properties of an FIR-prototype filter.

According to the invention, the filter circuit arrangement comprises a plurality, K, of FIR-filter members, each having a length $N_k$ and including $N_k$−1 state memories connected in series with each other to obtain the behavior of an FIR-prototype filter, means for multiplying input values and output values of the state memories with a plurality of filter coefficients to form resulting products and means for adding the resulting products to obtain an output signal, wherein a K th one of the FIR-filter members is an equalizer filter of length $N_A$ and comprises means for equalizing an entire frequency characteristic of the filter circuit arrangement so that a tolerance scheme of the FIR-prototype filter is maintained, with the proviso that a total number of multiplier means present in the filter circuit arrangement is not greater than that present in the FIR-prototype filter and a total number of delay elements in the filter circuit arrangement is at most the same or at most 10% higher than in the FIR-prototype filter, and wherein each of a remaining portion of the FIR-filter members (5.1 to 5.(K−1)) designated by k from 1 to K−1 respectively is formed as a 1/M band filter of length $N_k$, and $$N_A \leq N - \sum_{k=1}^{K-1} P_k,$$

wherein $P_k = N_k - 2\lfloor \frac{1}{2}(N_k-1)\rfloor/M_k \rfloor$.

The filter circuit arrangement according to the invention has the advantages that it has an equalizer filter which performs an equalization in the bandpass region, has clearly improved damping properties with about the same circuitry engineering expense and/or requires reduced coefficient word length. Particularly the number of multiplier circuits may be reduced, but at least can be maintained the same.

It is especially advantageous to use half-band filters with advantageously shorter filter length, advantageously less than N/10, as the FIR-filter members other than the equalizer filter. Thus a shorter coefficient word length results.

Special advantages can be obtained in regard to a reduction in circuit expense, when the filter length of the equalizer filter member is not substantially less than the filter length of the FIR-prototype filter. The FIR-prototype filter is a commercially obtainable FIR filter which has the required behavior.

Further advantageous features of the invention are described in the dependent claims appended hereinbelow.

BRIEF DESCRIPTION OF THE DRAWING

The objects, features and advantages of the invention will now be illustrated in more detail with the aid of the following description of the preferred embodiments, with reference to the accompanying figures in which:

FIG. 1a shows a block diagram of a prior art FIR-prototype filter;

FIG. 1b shows a block diagram of a cascade filter according to the invention; and FIGS. 2a to 2d are graphical illustrations of the frequency response of various examples of the filter according to the invention.

DESCRIPTION OF THE PREFERRED EMBODIMENTS

Figure 2B:
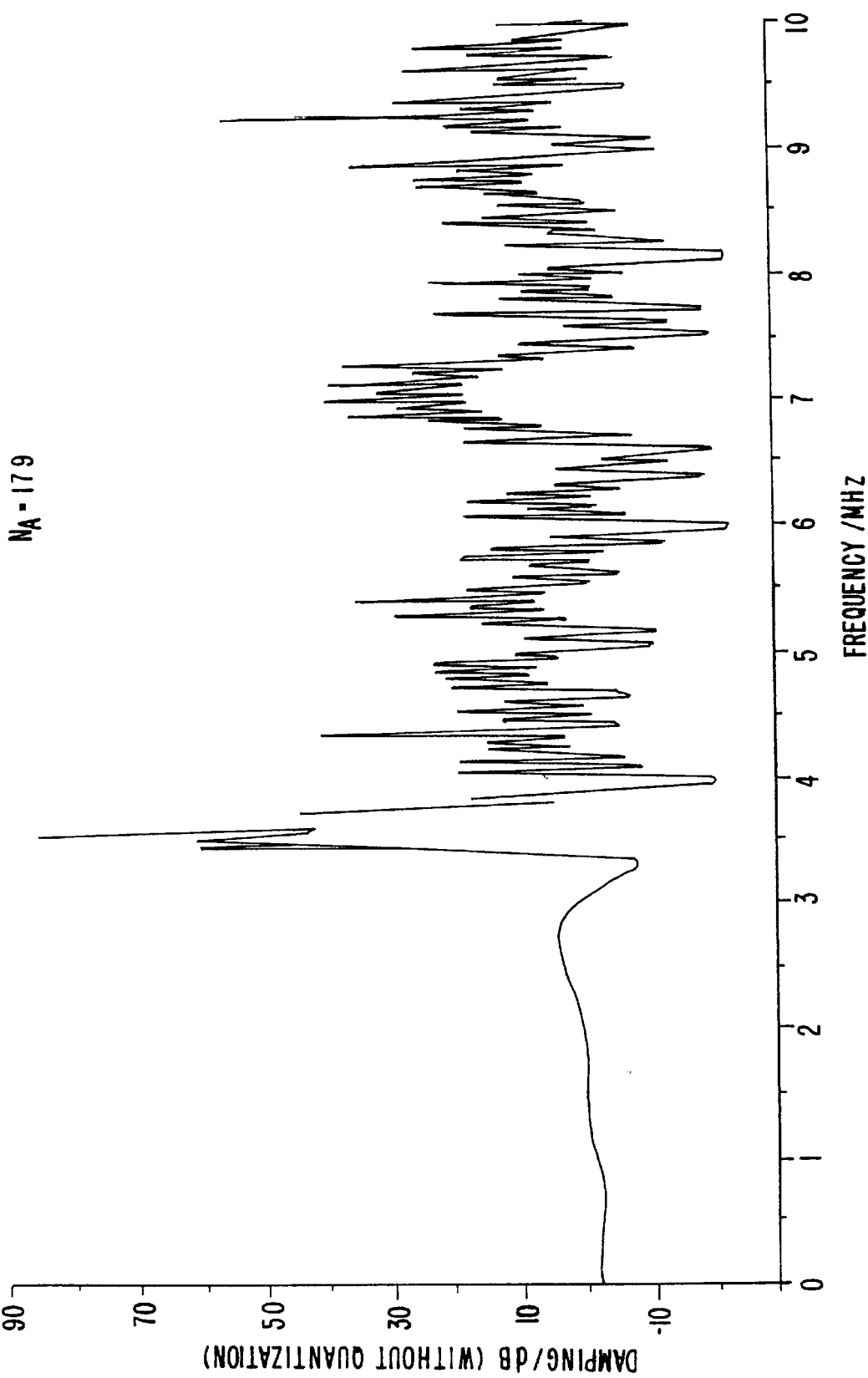

An FIR-prototype filter 1 with a filter length of N comprising N−1 state memories and N multipliers for the N coefficients serves as a prototype and is shown in the schematic illustration in FIG. 1a. By selection of the coefficients low-pass, band-pass or high-pass performance can be obtained in which bandpass and cutoff regions can be arbitrarily selected. The FIR-prototype filter 1 can also have a broad or narrow bandwidth.

This FIR-prototype filter 1 is now replaced according to the invention by a cascade filter 3 as shown in FIG. 1b, which has substantially the same transmission function and the same filter properties as the FIR-prototype filter of FIG. 1a.

This filter 3 according to the invention includes K individual filter members 5.1, 5.2, 5.K−1 and 5.K. All these individual FIR-filter members 5 are actualized or constructed as FIR filters, in which the individual FIR-filter member 5.1, for example, has the structure of this type of FIR filter. As already mentioned, it is a filter with a filter length of $N_1$ in which $N_1-1$ state memories 1, 2, . . . , $N_1-1$ are connected in series with each other. Their output valves are multiplied by multipliers 30 with filter coefficients h and added up by means 40 for adding to obtain an output signal. The remaining individual filter members 5.2 to 5.K are constructed in the same way and differ only in their filter length N and of course in the values of their filter coefficients.

In a preferred embodiment the individual FIR-filter elements or members 5.1 to 5.K−1 are each a so-called 1/M-band filter, advantageously a half-band filter (M=2). The individual filter members acting as a low-pass or high-pass filters are characterized by the occurrence of zeros for certain coefficients. Because of that, a multiplier may be omitted for each zero coefficient. The total number of multipliers of this 1/M-band filter is given by the formula (I):

$$P_k = N_k - 2 \lfloor \lfloor \tfrac{1}{2}(N_k-1) \rfloor / M_k \rfloor \qquad (I),$$

wherein after the division by $M_k$ only the whole number portion remains, i.e. the fractional portion is discarded, (that is, $\lfloor \rfloor$ means that the fractional portion inside the two opposed symbols is discarded and only the whole number remains).

Another possible method of eliminating multipliers uses linear phase filters 5.1 to 5.K−1. Because of the symmetry of the coefficients, at least two coefficients can be combined, so that only one multiplier is required. Also it is possible to economize with non-linear phase prototype filters in which the equalizer filter is usually selected to be phase non-linear.

The individual FIR-filter member 5.K indicated as somewhat emphasized or bold in FIG. 1 is designed as an equalizer filter in which an equalization should be performed in the bandpass region. Understandably the equalizer filter must not necessarily be arranged at the end of the cascade. In fact, it can be placed at any position in the cascade.

The splitting of the FIR-prototype filter 1 into the cascade filter 3 is performed as follows:

First the FIR-prototype filter 1 of the filter length N in approximate minimum N is given, whereby a minimum design reserve is maintained for the coefficient quantization.

Based on this prototype filter the number K of individual filter members is established, whereby at least K=2 filter members are provided, namely at least one 1/M band filter and exactly one equalizer filter 5.K.

The coefficient word lengths similarly are kept short by suitable selection of shorter filter lengths, $N_1, \ldots, N_K-1$.

The selected individual FIR-filter members 5.1 to 5.K−1 have thus all together $P_G$ multipliers according to formula (II):

$$P_G = \sum_{k=1}^{K-1} P_k$$

The filter length $N_A$ of the equalizer filter 5.K as a result is calculated according to formula or equation (III):

$$N_A \leq N - P_G. \qquad (III)$$

It has been shown that the results are very good in regard to the achievable damping with non-quantized coefficients in the equalizer filter 5.K, when $$P_G << N_A \leq N \qquad (IV).$$

Then the number of state memories in filter 3 is given by:

$$N_Z = \sum_{k=1}^{K}(N_k - 1) = \sum_{k=1}^{K} N_k - K, \qquad (V)$$

and is only slightly greater than the number of state memories N−1 of prototype filter 1. As already mentioned, this especially does not result in "Frequency Response Masking" engineering. Since the number of state memories $N_z$ remaining does not correspond to the number of state memories in the FIR-prototype filter 1, the accomplishments of the invention cannot be obtained by a simple splitting of the FIR-prototype filter into cascaded filter parts.

Although the number of state memories also increases, a definite expense reduction can be attained, since the number of multipliers does not increase and the coefficient word length is reduced. In digital filters the circuit engineering, especially for the multipliers, results in the major part of the expenses. The expense of each individual multiplier strongly depends on the word length of the coefficients.

The advantages of the filter 3 according to the invention in comparison to the prototype filter 1 should be made more apparent with the aid of the following two examples.

The prototype filter has a given filter length of N=211 and N−1=210 state memories. The degree of filtration results from the following filter givens:

The scanning frequency is $f_A$=14,138 MHz, the bandpass frequency $f_d$=3,295 MHz and the cutoff frequency $f_s$=3.5 MHz. The cutoff damping $\Theta a_s$ should not exceed 75 dB and the peak-peak damping difference in the bandpass range $\Delta a_{pp}$ should be smaller than 0.2 dB. The damping of the resulting filter in the cutoff region $a_s$ is better than 76.1 dB at a $\Delta a_{pp} \leq 0.176$ dB with non-quantized coefficients.

With a coefficient word length of $W_C$=16 bit the damping in the cutoff region drops to 64.5 dB with unchanged $\Delta a_{ppq}$.

In a first example the FIR-prototype filter 1 should be replaced by K=5 cascaded FIR-filter members. Four identical half-band filters (M1= . . . =M4=2) are used. All four half-band filters should have a filter length N1= . . . N4=7. The half-band filter has a total of $P_G$=20 multipliers.

Because of that, a value of 191 results for $N_A$ according to the foregoing formula. The total number of multipliers of the filter amounts to 191+20=211, which corresponds to the number of the prototype filter. In regard to the number of state memories $N_z$ a value of 214 results, also four more than the prototype filter.

Although the number of multipliers is not increased, a value of 75.4 dB at a $\Delta a_{pp} \leq 0.2$ dB with both non-quantized and quantized coefficients results. Thus the requirement for the prototype filter of 75 dB is also completely fulfilled.

In second example the number of FIR-filter members K is similarly given by K=5 and again four half-band filters are used. In contrast to the above-mentioned example, the filter lengths however are not identical, but are as a result selected so that:

$N_1$=7, $N_2$=11, $N_3$=15 and $N_4$=19.

The respective number of multipliers are $P_1$=5, $P_2$=7, $P_3$=9 and $P_4$=11, of course also altogether 32 multipliers are used in the half-band filter.

From the above-mentioned formula $N_A$ amounts to 179 so that the total number of multipliers amounts to 179+32=211. This is not an increase in relation to the prototype filter. To be sure the number of state memories has increase about 16 from 210 to 226.

In contrast to the first example the damping in the cutoff region can be increased both for the non-quantized and also for the quantized coefficients to a value of 76.2 dB.

In FIG. 2a the measured damping values are shown versus the frequency. It is seen clearly that the damping in the cutoff region is clearly greater than 75 dB.

Figure 2C:
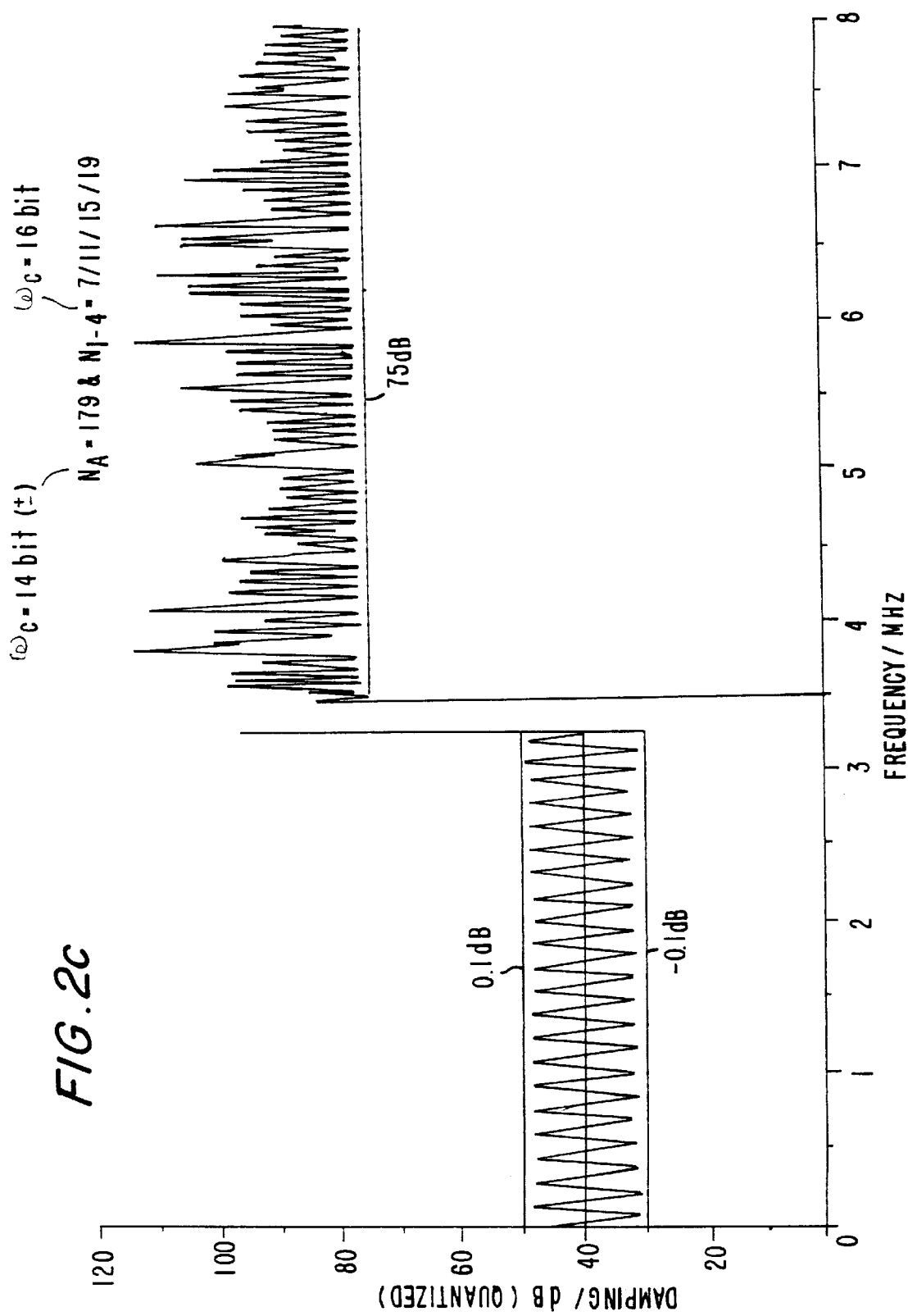
Figure 2D:
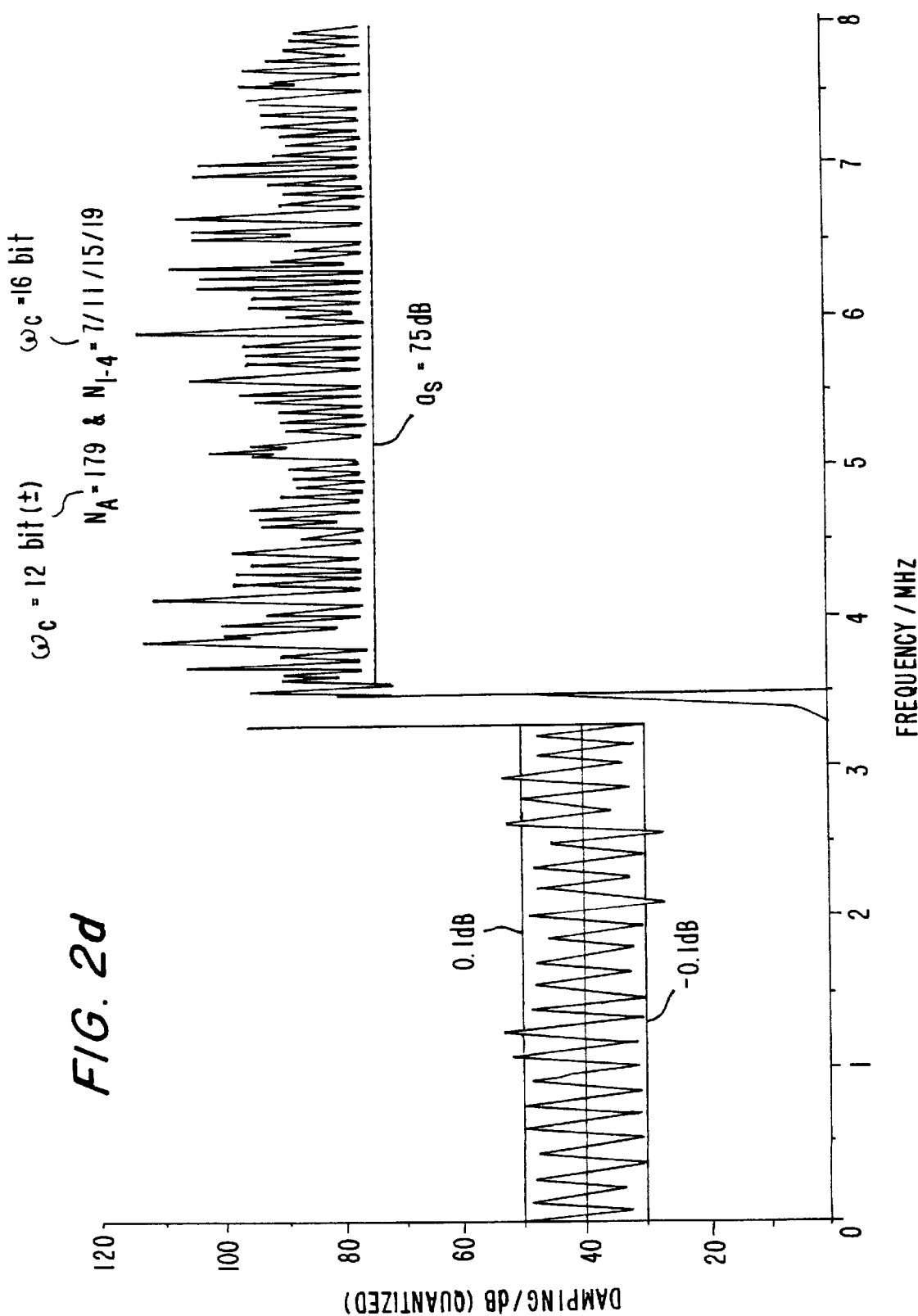

In this example it is even possible to reduce the word length of the equalizer filter to 14 and/or 12 bits, without impairing the specifications given by the prototype filter. In FIG. 2c and 2d the corresponding behavior for a 14 bit word length and a 12 bit word length is shown. With the word length of 12 bits selected, $\Delta a_{pp}$ of 0.2 dB is easily exceeded, which however still is in an acceptable range.

The frequency behavior of the equalizer filter is shown with a filter length of $N_A=179$ for illustration of the operation of the equalizer filter. Clearly its equalizer function is seen in the bandpass region.

While the invention has been illustrated and described as embodied in a filter circuit arrangement with a plurality of cascaded FIR filters, it is not intended to be limited to the details shown, since various modifications and changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed is new and is set forth in the following appended claims.

I claim:

1. A filter circuit arrangement (3) comprising a plurality (K) of cascaded FIR-filter members (5.1, ..., 5.K) connected with each other to obtain the behavior of an FIR prototype filter having a filter length N;

wherein each of said FIR-filter members have a length $N_k$ and include $N_k-1$ state memories connected in series with each other, with $k \leq K$;

wherein each of said FIR-filter members, except for one (5.K) of said FIR-filter members, include multipliers (30) for multiplying input values and output values of said state memories with a plurality of filter coefficients (h) to form resulting products and means (40) for adding said resulting products to obtain an output signal;

wherein said one (5.K) of said FIR-filter members is an equalizer filter of length $N_A$ and comprises means for equalizing an entire frequency characteristic of the filter circuit arrangement so that a predetermined tolerance scheme of said FIR-prototype filter is maintained, with the proviso that a total number of said multipliers (30) for multiplying present in the filter circuit arrangement is not greater than that present in said FIR-prototype filter;

wherein each of a remaining portion of said FIR-filter members (5.1 to 5.(K−1)) is designated by k from 1 to K−1 and comprises a $1/M_k$ band filter of length $N_k$, with $M_k$=an integer;

wherein $P_k$ is a total number of said multipliers in a k th one of said FIR filter members (5.1 to 5.(K−1)) and $$P_k = N_k - 2\lfloor[\tfrac{1}{2}(N_k-1)]/M_k\rfloor$$

in which $\lfloor x \rfloor$ means a fractional portion of x is discarded so that said $\lfloor x \rfloor$ is in an integer quantity; and wherein $$N_A \leq N - \sum_{k=1}^{K-1} P_k.$$

2. The filter circuit arrangement (3) as defined in claim 1, wherein said equalizer filter has a bandpass region and includes means for performing an equalization within said bandpass region and means for adjusting a total damping outside said bandpass region.

3. A filter circuit arrangement (3) comprising a plurality (K) of cascaded FIR-filter members (5.1, ..., 5.K) connected with each other to obtain the behavior of an FIR prototype filter having a filter length N;

wherein each of said FIR-filter members have a length $N_k$ and include $N_k-1$ state memories connected in series with each other, with $k \leq K$;

wherein each of said FIR-filter members, except for one (5.K) of said FIR-filter members, include multipliers (30) for multiplying input values and output values of said state memories with a plurality of filter coefficients (h) to form resulting products and means (40) for adding said resulting products to obtain an output signal;

wherein said one (5.K) of said FIR-filter members is an equalizer filter of length $N_A$ and comprises means for equalizing an entire frequency characteristic of the filter circuit arrangement so that a predetermined tolerance scheme of said FIR-prototype filter is maintained, with the proviso that a total number of said multipliers (30) for multiplying present in the filter circuit arrangement is not greater than that present in said FIR-prototype filter;

wherein each of a remaining portion of said FIR-filter members (5.1 to 5.(K−1)) is designated by k from 1 to K−1 and comprises a $1/M_k$ band filter of length $N_k$, with $M_k$=an integer;

wherein $P_k$ is a total number of said multipliers in a k th one of said FIR filter members (5.1 to 5.(K−1)) and $$P_k = N_k - 2\lfloor[\tfrac{1}{2}(N_k-1)]/M_k\rfloor$$

in which $\lfloor x \rfloor$ means a fractional portion of x is discarded so that said $\lfloor x \rfloor$ is in an integer quantity; and wherein $$N_A \leq N - \sum_{k=1}^{K-1} P_k,$$

wherein each of said $1/M_k$ band filters is a half-band filter.

4. A filter circuit arrangement (3) comprising a plurality (K) of cascaded FIR-filter members (5.1, ..., 5.K) connected with each other to obtain the behavior of an FIR prototype filter having a filter length N;

wherein each of said FIR-filter members have a length $N_k$ and include $N_k-1$ state memories connected in series with each other, with $k \leq K$;

wherein each of said FIR-filter members, except for one (5.K) of said FIR-filter members, include multipliers (30) for multiplying input values and output values of said state memories with a plurality of filter coefficients (h) to form resulting products and means (40) for adding said resulting products to obtain an output signal;

wherein said one (5.K) of said FIR-filter members is an equalizer filter of length $N_A$ and comprises means for equalizing an entire frequency characteristic of the filter circuit arrangement so that a predetermined tolerance scheme of said FIR-prototype filter is maintained, with the proviso that a total number of said multipliers (30) for multiplying present in the filter circuit arrangement is not greater than that present in said FIR-prototype filter;

wherein each of a remaining portion of said FIR-filter members (5.1 to 5.(K−1)) is designated by k from 1 to K−1 and comprises a $1/M_k$ band filter of length $N_k$, with $M_k$=an integer;

wherein $P_k$ is a total number of said multipliers in a k th one of said FIR filter members (5.1 to 5.(K−1)) and $$P_k = N_k - 2 \lfloor \frac{1}{2}(N_k-1) / M_k \rfloor$$

in which $\lfloor x \rfloor$ means a fractional portion of x is discarded so that said $\lfloor x \rfloor$ is in an integer quantity; and wherein $$N_A \leq N - \sum_{k=1}^{K-1} P_k,$$

wherein said equalizer filter is a final one of said series of said cascaded FIR-filter members.

5. The filter circuit arrangement (3) as defined in claim 1, wherein each of said $1/M_k$ band filters have a filter length ($N_k$) less than N/10.

6. A filter circuit arrangement (3) comprising a plurality (K) of cascaded FIR-filter members (5.1, ..., 5.K) connected with each other to obtain the behavior of an FIR prototype filter having a filter length N;

wherein each of said FIR-filter members have a length $N_k$ and include $N_k-1$ state memories connected in series with each other, with $k \leq K$;

wherein each of said FIR-filter members, except for one (5.K) of said FIR-filter members, include multipliers (30) for multiplying input values and output values of said state memories with a plurality of filter coefficients (h) to form resulting products and means (40) for adding said resulting products to obtain an output signal;

wherein said one (5.K) of said FIR-filter members is an equalizer filter of length $N_A$ and comprises means for equalizing an entire frequency characteristic of the filter circuit arrangement so that a predetermined tolerance scheme of said FIR-prototype filter is maintained, with the proviso that a total number of said multipliers (30) for multiplying present in the filter circuit arrangement is not greater than that present in said FIR-prototype filter;

wherein each of a remaining portion of said FIR-filter members (5.1 to 5.(K−1)) is designated by k from 1 to K−1 and comprises a $1/M_k$ band filter of length $N_k$, with $M_k$=an integer;

wherein $P_k$ is a total number of said multipliers in a k th one of said FIR filter members (5.1 to 5.(K−1)) and $$P_k = N_k - 2 \lfloor \frac{1}{2}(N_k-1) / M_k \rfloor$$

in which $\lfloor x \rfloor$ means a fractional portion of x is discarded so that said $\lfloor x \rfloor$ is in an integer quantity; and wherein $$N_A \leq N - \sum_{k=1}^{K-1} P_k,$$

wherein a sum of multipliers ($P_G$) of a K−1 th one of said $1/M_k$ band filters, $$P_G = \sum_{k=1}^{K-1} P_k,$$

is much smaller than N, so that $N_A \leq N$.

7. A filter circuit arrangement (3) comprising a plurality (K) of cascaded FIR-filter members (5.1, ..., 5.K) connected with each other to obtain the behavior of an FIR prototype filter having a filter length N;

wherein each of said FIR-filter members have a length $N_k$ and include $N_k-1$ state memories connected in series with each other, with $k \leq K$;

wherein each of said FIR-filter members, except for one (5.K) of said FIR-filter members, include multipliers (30) for multiplying input values and output values of said state memories with a plurality of filter coefficients (h) to form resulting products and means (40) for adding said resulting products to obtain an output signal;

wherein said one (5.K) of said FIR-filter members is an equalizer filter of length $N_A$ and comprises means for equalizing an entire frequency characteristic of the filter circuit arrangement so that a predetermined tolerance scheme of said FIR-prototype filter is maintained, with the proviso that a total number of said multipliers (30) for multiplying present in the filter circuit arrangement is not greater than that present in said FIR-prototype filter;

wherein each of a remaining portion of said FIR-filter members (5.1 to 5.(K−1)) is designated by k from 1 to K−1 and comprises a $1/M_k$ band filter of length $N_k$, with $M_k$=an integer;

wherein $P_k$ is a total number of said multipliers in a k th one of said FIR filter members (5.1 to 5.(K−1)) and $$P_k = N_k - 2 \lfloor \frac{1}{2}(N_k-1) / M_k \rfloor$$

in which $\lfloor x \rfloor$ means a fractional portion of x is discarded so that said $\lfloor x \rfloor$ is in an integer quantity; and wherein $$N_A \leq N - \sum_{k=1}^{K-1} P_k,$$

wherein said FIR-prototype filter is such that said FIR-prototype filter performs the predetermined tolerance scheme with non-quantized ones of said filter coefficients with minimal reserve.

8. A filter circuit arrangement (3) comprising a plurality (K) of cascaded FIR-filter members (5.1, ..., 5.K) connected with each other to obtain the behavior of an FIR prototype filter having a filter length N;

wherein each of said FIR-filter members have a length $N_k$ and include $N_k-1$ state memories connected in series with each other, with $k \leq K$;

wherein each of said FIR-filter members, except for one (5.K) of said FIR-filter members, include multipliers

(30) for multiplying input values and output values of said state memories with a plurality of filter coefficients (h) to form resulting products and means (40) for adding said resulting products to obtain an output signal;

wherein said one (5.K) of said FIR-filter members is an equalizer filter of length $N_A$ and comprises means for equalizing an entire frequency characteristic of the filter circuit arrangement so that a predetermined tolerance scheme of said FIR-prototype filter is maintained, with the proviso that a total number of said multipliers (30) for multiplying present in the filter circuit arrangement is not greater than that present in said FIR-prototype filter;

wherein each of a remaining portion of said FIR-filter members (5.1 to 5.(K−1)) is designated by k from 1 to K−1 and comprises a $1/M_k$ band filter of length $N_k$, with $M_k$=an integer;

wherein $P_k$ is a total number of said multipliers in a k th one of said FIR filter members (5.1 to 5.(K−1)) and $$P_k = N_k - 2\lfloor [½(N_k-1)]/M_k \rfloor$$

in which $\lfloor x \rfloor$ means a fractional portion of x is discarded so that said $\lfloor x \rfloor$ is in an integer quantity; and wherein $$N_A \leq N - \sum_{k=1}^{K-1} P_k,$$

wherein said equalizer filter is not linear-phased and each of said $1/M_k$ band filters is linear-phased.

* * * * *